United States Patent
Cheng (10) Patent No.: US 10,825,917 B1
(45) Date of Patent: Nov. 3, 2020

(54) BULK FINFET WITH FIN CHANNEL HEIGHT UNIFORMITY AND ISOLATION

(71) Applicant: INTERNATIONAL BUSINESS MACHINES CORPORATION, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/379,184

(22) Filed: Apr. 9, 2019

(51) Int. Cl.
| | |
|---|---|
| H01L 29/78 | (2006.01) |
| H01L 21/762 | (2006.01) |
| H01L 29/66 | (2006.01) |
| H01L 21/033 | (2006.01) |
| H01L 27/088 | (2006.01) |
| H01L 29/06 | (2006.01) |
| H01L 29/10 | (2006.01) |
| H01L 21/02 | (2006.01) |
| H01L 21/8234 | (2006.01) |
| H01L 29/16 | (2006.01) |

(52) U.S. Cl.
CPC .... *H01L 29/66795* (2013.01); *H01L 21/0214* (2013.01); *H01L 21/0228* (2013.01); *H01L 21/02381* (2013.01); *H01L 21/0332* (2013.01); *H01L 21/0337* (2013.01); *H01L 21/762* (2013.01); *H01L 21/823431* (2013.01); *H01L 21/823468* (2013.01); *H01L 21/823481* (2013.01); *H01L 27/0886* (2013.01); *H01L 29/0649* (2013.01); *H01L 29/1033* (2013.01); *H01L 29/16* (2013.01); *H01L 29/6653* (2013.01); *H01L 29/7851* (2013.01)

(58) Field of Classification Search
CPC .... H01L 27/11; H01L 27/1104; H01L 27/088; H01L 29/6659; H01L 21/823878; H01L 21/823807; H01L 21/76224; H01L 29/6653; H01L 29/78
USPC ........ 438/207, 199, 218, 219; 257/374, 368, 257/440, 93
See application file for complete search history.

(56) References Cited

U.S. PATENT DOCUMENTS

| | | | |
|---|---|---|---|
| 8,697,522 B2 | 4/2014 | Cheng et al. | |
| 8,716,786 B2 | 5/2014 | Baumgartner et al. | |
| 8,841,188 B2 | 9/2014 | Reznicek et al. | |
| 9,240,352 B2 | 1/2016 | Anderson et al. | |
| 9,431,521 B1 | 8/2016 | Cheng et al. | |
| 9,455,325 B2 | 9/2016 | Wann et al. | |

(Continued)

OTHER PUBLICATIONS

Wu et al., "High Performance 22/20nm FinFET CMOS Devices with Advanced High-K/Metal Gate Scheme", 2010 International Electron Devices Meeting. Dec. 6, 2010. (pp. 1-4).

*Primary Examiner* — Thinh T Nguyen
(74) *Attorney, Agent, or Firm* — Tutunjian & Bitetto, P.C.; Vazken Alexanian (57) ABSTRACT

A method is presented for forming a bulk fin field effect transistor (FinFET) with uniform fin channel height. The method includes recessing a semiconductor substrate to form a plurality of fins, forming sacrificial spacers adjacent the plurality of fins, recessing the semiconductor substrate to form a stepped configuration shallow trench isolation (STI) defining a plurality of trenches, removing the sacrificial spacers, and depositing a conformal dielectric to pinch off a bottom portion of plurality of trenches defined by the stepped configuration STI.

18 Claims, 6 Drawing Sheets

(56) References Cited

U.S. PATENT DOCUMENTS

| | | |
|---|---|---|
| 9,985,112 B2 | 5/2018 | Anderson et al. |
| 2012/0032267 A1* | 2/2012 | Cheng et al. ..... H01L 21/76237 |
| | | 257/368 |
| 2014/0159171 A1 | 6/2014 | Cai et al. |
| 2018/0097091 A1 | 4/2018 | Cheng et al. |

* cited by examiner

BULK FINFET WITH FIN CHANNEL HEIGHT UNIFORMITY AND ISOLATION

BACKGROUND

The present invention relates generally to semiconductor devices, and more specifically, to a bulk fin field effect transistor (FinFET) with improved fin channel height uniformity and isolation.

There are a number of challenges that scaling of conventional planar metal-oxide-semiconductor field-effect transistors (MOSFETs) are faced with. For example, subthreshold swing degradation, large drain-induced barrier lowering (DIBL), device characteristics fluctuations, and leakage current are among the most common issues that can be addressed by 3D device structures. FinFETs are 3D device structures that can be used in nano-scale complementary metal-oxide-semiconductor (CMOS) and high-density memory applications.

FinFET devices are divided into two categories, bulk FinFETs and silicon-on-insulator (SOI) FinFETs. In bulk FinFET devices, the fin can be formed on the bulk silicon (e.g., silicon substrate). The bulk FinFET can be produced at low cost, and at high heat transfer to substrate. In bulk FinFETs, the fin height corresponding to the active device width is defined by filling fin gaps with shallow trench isolation (STI) oxide and then recessing the STI oxide. Such an approach, however, leads to significant fin height variation primarily due to inherent variation in two processes, STI oxide chemical mechanical polishing (CMP) (dishing issue) and oxide recess (micro-loading, potential voids in STI oxide, etc.). Another issue with bulk FinFET fabrication is that the STI oxide is etched during downstream processing such as source/drain epitaxy clean, further increasing device variability.

SUMMARY

In accordance with an embodiment, a method is provided for forming a bulk fin field effect transistor (FinFET) with uniform fin channel height. The method includes recessing a semiconductor substrate to form a plurality of fins, forming sacrificial spacers adjacent the plurality of fins, recessing the semiconductor substrate to form a stepped configuration shallow trench isolation (STI) defining a plurality of trenches, removing the sacrificial spacers, and depositing a conformal dielectric to pinch off a bottom portion of plurality of trenches defined by the stepped configuration STI.

In accordance with another embodiment, a method is provided for forming a bulk fin field effect transistor (FinFET) with uniform fin channel height and uniform shallow trench isolation (STI). The method includes performing a two-step fin etch process to construct a stepped configuration STI defining a plurality of trenches and depositing a conformal dielectric to pinch off a bottom portion of plurality of trenches defined by the stepped configuration STI.

In accordance with yet another embodiment, a semiconductor structure is provided for forming a bulk fin field effect transistor (FinFET) with uniform fin channel height. The semiconductor structure includes a plurality of fins, each of the plurality of fins including a stepped configuration (STI) defining trenches, isolation regions disposed within the trenches, and a second dielectric layer disposed in direct contact with the isolation regions.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming shallow trench isolation (STI) in a bulk fin field effect transistor (FinFET). In particular, the exemplary embodiments form a FinFET with uniform STI independent of fin density. A two-step fin reactive ion etch (RIE) process is employed to achieve uniform STI. The structure includes a staircase or stepped fin configuration or stepped fin profile or stepped fin pattern with a dielectric cap over the STI.

Fins are usually separated by a filler material such as an insulator and/or oxide material. After bulk fin formation, fin heights relative to the filler material may not be uniform, and since the fin height controls the device width, this can result in undesired semiconductor device width. Accordingly, a need exists for an enhanced fin height control technique, for example, for use during FinFET device fabrication, which results in uniform fin height for a plurality of fins on a single substrate. In other words, different FinFETs having different fin pitches are used in different areas of a semiconductor apparatus. The differences in fin pitch results in different areas having different fin densities. During fin formation, a localized etch loading effect causes areas having different fin densities to have different fin heights. Depending on the etch process, low fin density areas can have longer fins or shorter fins relative to high fin density areas.

Embodiments in accordance with the present invention provide methods and devices for fabricating a bulk FinFET with uniform fin channel height and robust STI by employing a two-step fin etch process, where the final structure defines a stepped fin configuration.

Examples of semiconductor materials that can be employed in forming such structures include silicon (Si), germanium (Ge), silicon germanium alloys (SiGe), carbon doped silicon (Si:C), carbon doped silicon germanium carbide (SiGe:C), phosphorous doped silicon (Si:P), boride doped silicon germanium (SiGe:B), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
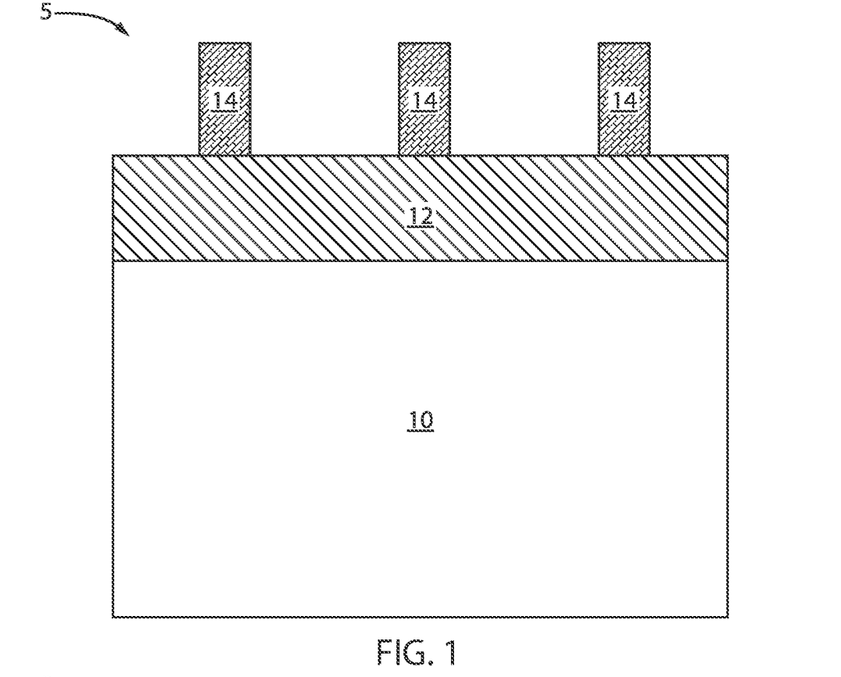
FIG. 1 is a cross-sectional view of a bulk semiconductor structure including a nitride hardmask and an oxide hardmask, in accordance with an embodiment of the present invention.

FIG. 1 is a cross-sectional view of a bulk semiconductor structure including a nitride hardmask and an oxide hardmask, in accordance with an embodiment of the present invention.

In structure 5, a nitride hardmask 12 can be formed over a substrate 10. An oxide hardmask 14 can then be formed over the nitride hardmask 12.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), Si:C (carbon doped silicon), carbon doped silicon germanium (SiGe:C), carbon doped silicon germanium (SiGe:C), III-V (e.g., GaAs, AlGaAs, InAs, InP, etc.), II-VI compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. In one example, the substrate 10 is a single crystalline silicon substrate.

The hardmask layer 12 can be a nitride, for example, a silicon nitride (SiN), an oxynitride, for example, silicon oxynitride (SiON), or a combination thereof. In a preferred embodiment, the hardmask layer 12 can be silicon nitride (SiN), for example, $Si_3N_4$.

In one or more embodiments, the hardmask layer 12 can have a thickness in the range of about 20 nm to about 100 nm, or in the range of about 35 nm to about 75 nm, or in the range of about 45 nm to about 55 nm, although other thicknesses are contemplated.

The hardmask layer 14 can be an oxide, for example, a silicon oxide hardmask. The hardmask layer 14 can be patterned by any suitable patterning techniques, including but not limited to, lithography followed by etching, sidewall image transfer (SIT), self-aligned double patterning (SADP), self-aligned multiple patterning (SAMP), self-aligned quadruple patterning (SAQP), or any suitable combination of those techniques.

In one or more embodiments, the hardmask layer 14 can have a thickness in the range of about 20 nm to about 100 nm, or in the range of about 35 nm to about 75 nm, or in the range of about 45 nm to about 55 nm, although other thicknesses are contemplated.

Figure 2:
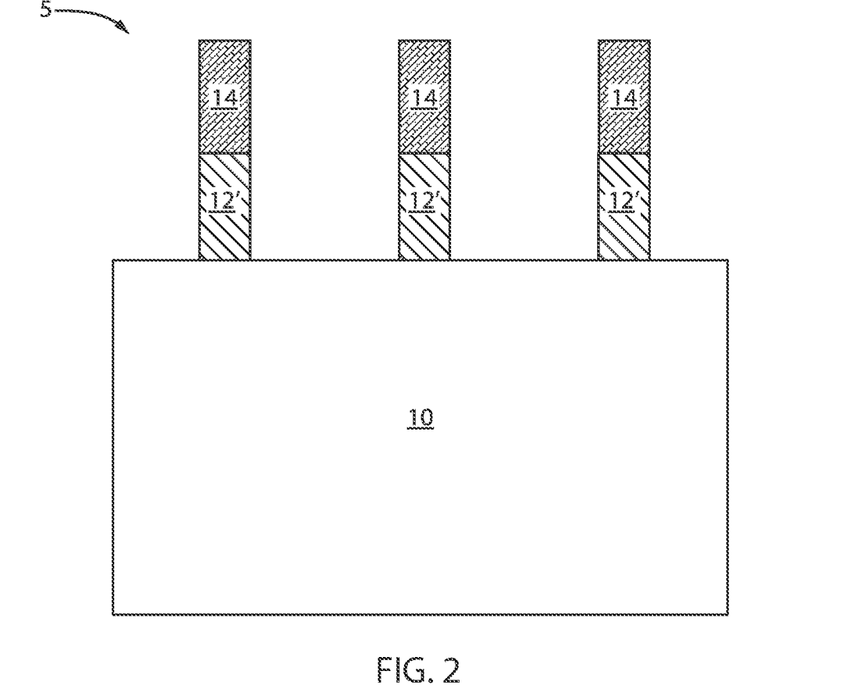
FIG. 2 is a cross-sectional view of the semiconductor structure of FIG. 1 where the nitride hardmask is patterned, in accordance with an embodiment of the present invention.

FIG. 2 is a cross-sectional view of the semiconductor structure of FIG. 1 where the nitride hardmask is patterned, in accordance with an embodiment of the present invention.

In various example embodiments, the nitride hardmask 12 is patterned such that nitride portions 12' remain under the oxide hardmask 14. The nitride hardmask 12 can be etched by, e.g., reactive ion etching (RIE).

Figure 3:
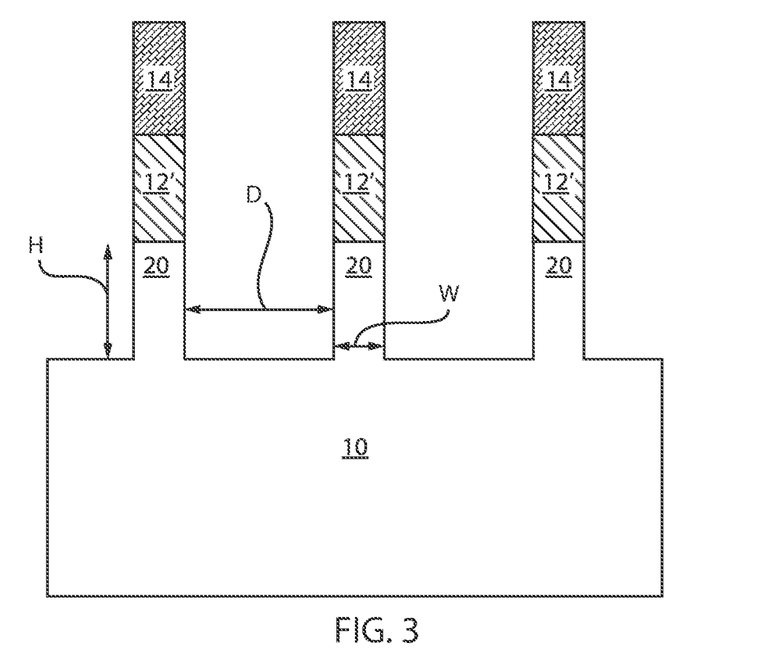
FIG. 3 is a cross-sectional view of the semiconductor structure of FIG. 2 where a first fin recess takes place, in accordance with an embodiment of the present invention.

FIG. 3 is a cross-sectional view of the semiconductor structure of FIG. 2 where a first fin recess takes place, in accordance with an embodiment of the present invention.

In various example embodiments, a first fin recess takes place to form fins 20. Fins 20 are formed directly underneath the nitride portions 12'. The height of the fins 20 can be designated as "H," the width of the fins 20 can be designated as "W," and the distance between the fins 20 can be designated as "D." In one example, the fin height can be about 40 nm, the fin width can be about 6 nm, the distance between the fins 20 can be referred to as a fin gap and be, e.g., about 26 nm, and the fin pitch can be about 32 nm. Of course, one skilled in the art can contemplate other dimensions.

Although this is a timed etch, the fin height uniformity is better than conventional methods because the starting point is the flat substrate surface and the material is being etch from a single crystalline silicon, which provides for better uniformity.

The fins 20 can be formed from a semiconductor material including, but not limited to Si, strained Si, Si:C, SiGe, SiGe:C, Si alloys, Ge, Ge alloys, GaAs, InAs, InP, as well as other III/V and II/VI compound semiconductors. The fins 20 can be etched by employing, e.g., a reactive ion etch (RIE) or the like. In other embodiments, the etching can include a dry etching process such as, for example, reactive ion etching, plasma etching, ion etching or laser ablation. The etching can further include a wet chemical etching process in which one or more chemical etchants are employed to remove portions of the layers.

Figure 4:
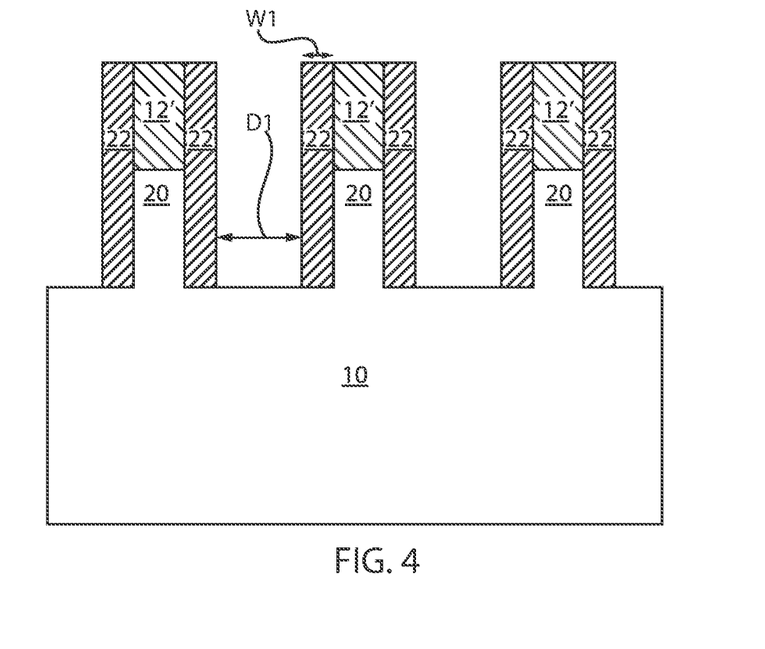
FIG. 4 is a cross-sectional view of the semiconductor structure of FIG. 3 where the oxide hardmask is removed and spacers are formed adjacent the fins, in accordance with an embodiment of the present invention.

FIG. 4 is a cross-sectional view of the semiconductor structure of FIG. 3 where the oxide hardmask is removed and spacers are formed adjacent the fins, in accordance with an embodiment of the present invention.

In various example embodiments, the oxide hardmask 14 can be optionally stripped to expose the nitride portions 12'. Alternatively, the oxide hardmask 14 can be removed in a later process. Then, spacers 22 are formed adjacent the fins 20 and the nitride portions 12'.

Spacers 22 can include any of one or more of SiN, SiBN, SiCN and/or SiBCN films. The width of the spacers 22 can be designated as W1. The width W1 of the spacers 22 can be, e.g., about 4 nm. Thus, the distance between the fins 20 is now designated as "D1." The distance D1 can be, e.g., about 18 nm.

Figure 5:
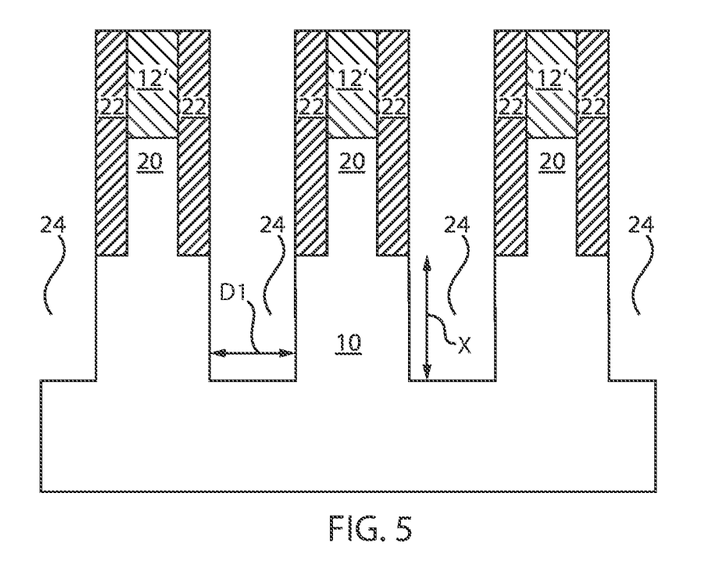
FIG. 5 is a cross-sectional view of the semiconductor structure of FIG. 4 where a second fin recess takes place, in accordance with an embodiment of the present invention.

FIG. 5 is a cross-sectional view of the semiconductor structure of FIG. 4 where a second fin recess takes place, in accordance with an embodiment of the present invention.

In various example embodiments, a second fin recess takes place. The recess results in opening or trenches 24 formed between the fins 20. The openings 24 can extend a distance "X" below the bottom surface of the fins 20. The distance D1 between the fins 20 remains the same. That is, the distance D1 between the fins 20 is about 18 nm.

Figure 6:
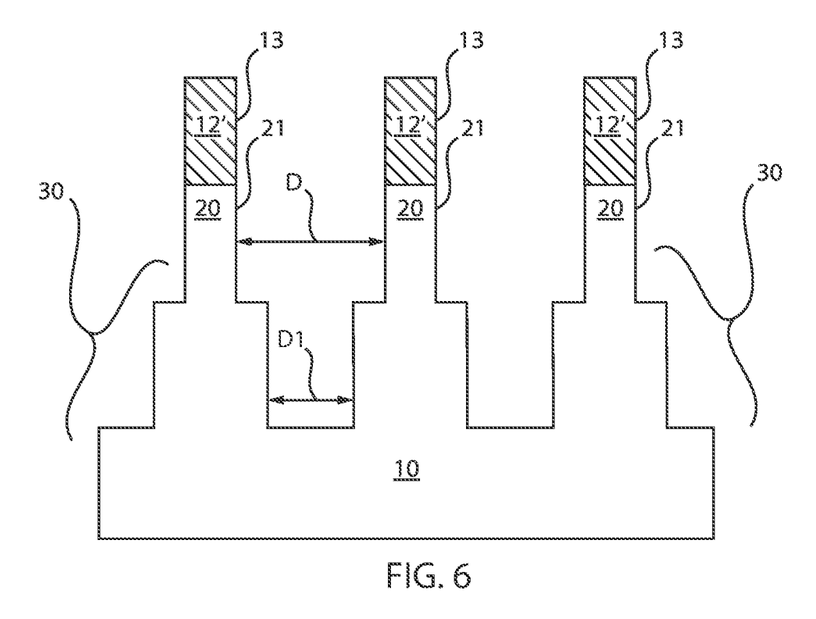
FIG. 6 is a cross-sectional view of the semiconductor structure of FIG. 5 where the spacers are removed, in accordance with an embodiment of the present invention.

FIG. 6 is a cross-sectional view of the semiconductor structure of FIG. 5 where the spacers are removed, in accordance with an embodiment of the present invention.

In various example embodiments, the spacers 22 are removed to expose sidewalls 21 of the fins 20 and sidewalls 13 of the nitride portions 12'. The distance between the fins 20 is D, which is about 26 nm. Additionally, a stair-shaped shallow trench isolation (STI) region 30 is formed. The STI region 30 has a step-wise or stepped configuration or stepped profile. The top of the STI region 30 is narrower than the bottom of the STI region 30 (narrow top and wide bottom).

Figure 7:
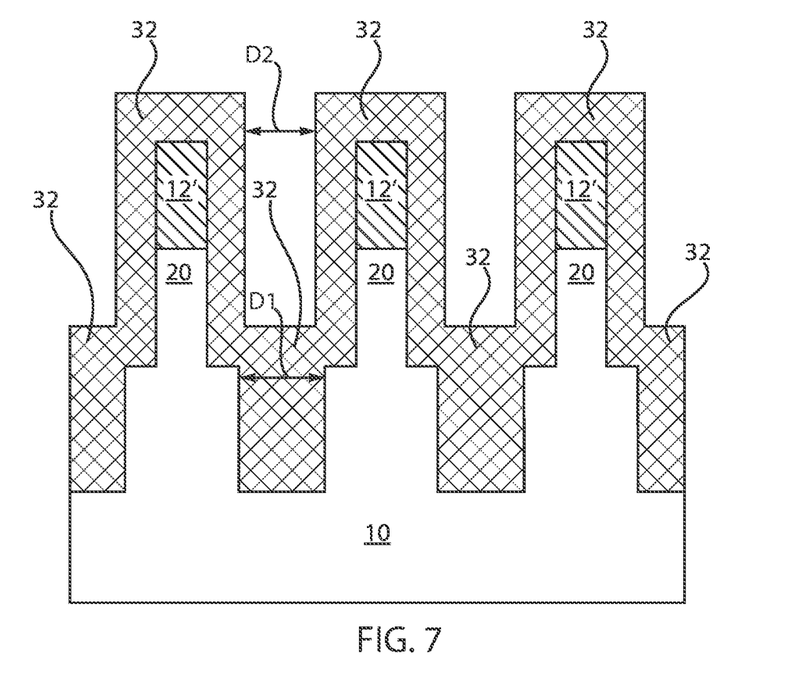
FIG. 7 is a cross-sectional view of the semiconductor structure of FIG. 6 where a conformal dielectric is deposited, in accordance with an embodiment of the present invention.

FIG. 7 is a cross-sectional view of the semiconductor structure of FIG. 6 where a conformal dielectric is deposited, in accordance with an embodiment of the present invention.

In various example embodiments, a conformal dielectric 32 is deposited. The conformal dielectric 32 completely pinches off the bottom portion of the trenches. In one example, the conformal dielectric 32 can have a thickness of about 10 nm. Thus, the distance "D2" between consecutive conformal dielectrics 32 formed over fins 20 is about 8 nm. The conformal dielectric 32 can be silicon oxide and can be deposited by, e.g., atomic layer deposition (ALD) or chemical vapor deposition (CVD).

Figure 8:
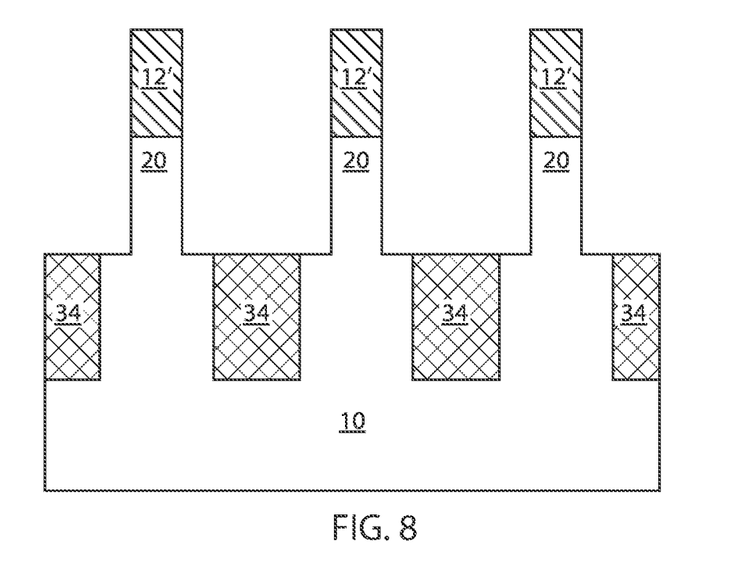
FIG. 8 is a cross-sectional view of the semiconductor structure of FIG. 7 where the conformal dielectric is etched to reveal the fins, in accordance with an embodiment of the present invention.

FIG. 8 is a cross-sectional view of the semiconductor structure of FIG. 7 where the conformal dielectric is etched to reveal the fins, in accordance with an embodiment of the present invention.

In various example embodiments, the conformal dielectric is etched to reveal the fins. This results in isolation regions 34 formed within the substrate 10. This further results in sidewalls of the fins 20 and sidewalls of the nitride portions 12' being revealed or exposed. In other words, isolation regions 34 are only formed in the lower portion of the STI trenches. In one example, a chemical oxide removal (COR) etch can be employed to target 12 nm oxide to completely remove the 10 nm oxide formed adjacent the fins 20 and the adjacent the nitride portions 12'.

Figure 9:
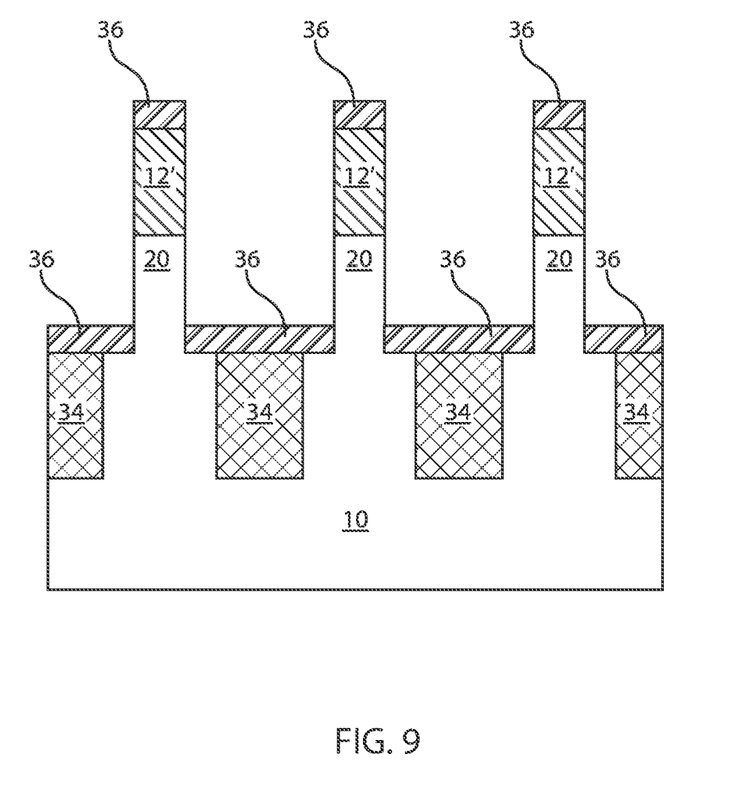
FIG. 9 is a cross-sectional view of the semiconductor structure of FIG. 8 where a nitride layer is formed by directional deposition, in accordance with an embodiment of the present invention.

FIG. 9 is a cross-sectional view of the semiconductor structure of FIG. 8 where a second dielectric layer is formed by directional deposition, in accordance with an embodiment of the present invention.

In various example embodiments, a nitride layer 36 is formed by directional deposition. The second dielectric layer 36 can be e.g., silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. The dielectric material can be a low-k material having a dielectric constant of less than about 7, or of less than about 5. The second dielectric layer 36 can have a thickness of about 6 nm. In one example, the directional deposition can be, e.g., by high plasma deposition (HDP). The directional deposition results in thicker deposited on horizontal surfaces and thinner film deposited on vertical sidewalls. In some embodiments, an etch back process can be performed to remove any second dielectric layer 36 deposited on the sidewall of the fins.

The second dielectric layer 36 is formed over the isolation regions 34 and over the nitride portions 12'. The second dielectric layer 36 directly contacts lower portions or sections of the fins 20. The second dielectric layers 36 at the lower portions or sections of the fins 20 aid in the reduction of parasitic capacitance between the gate and silicon (Si) substrate.

Therefore, the exemplary embodiments of the present invention form STI in a bulk FinFET. In particular, the exemplary embodiments form a FinFET with uniform fin height and uniform STI independent of fin density. A two-step fin RIE process is employed to achieve uniform STI. The structure includes a staircase or stepped fin configuration or stepped fin profile or stepped fin pattern with a dielectric cap over the STI.

Figure 10:
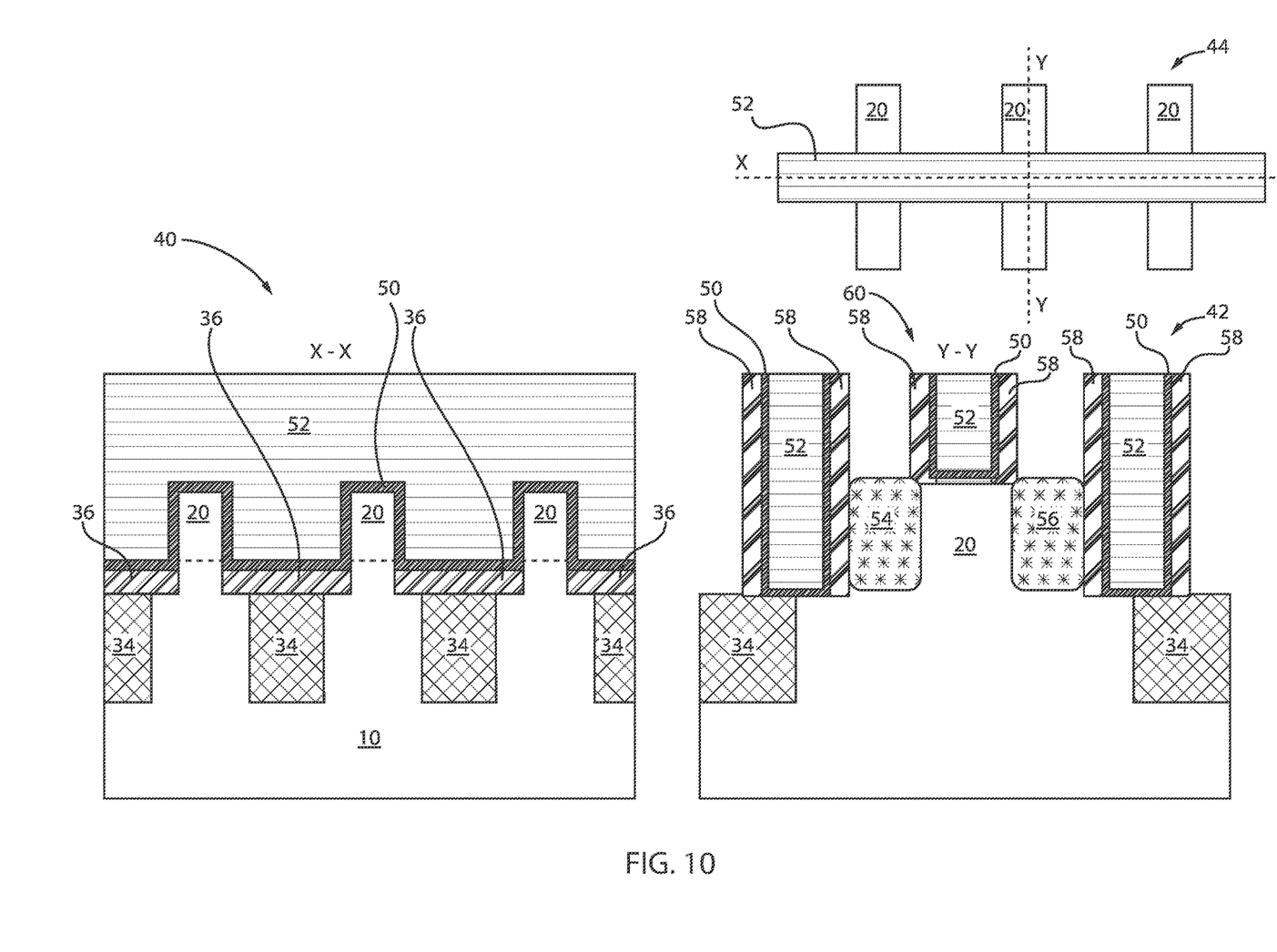
FIG. 10 is a cross-sectional view of the semiconductor structure of FIG. 9 where a gate (for example, high-k gate dielectric and metal gate (HKMG)) and source, drain, and gate contacts are formed, in accordance with an embodiment of the present invention.

FIG. 10 is a cross-sectional view of the semiconductor structure of FIG. 9 where a gate (for example, high-k gate dielectric and metal gate (HKMG)) and source, drain, and gate contacts are formed, in accordance with an embodiment of the present invention.

In various example embodiments, a high-k dielectric 50 and a metal gate 52 are deposited.

In the X-X view 40, the high-k dielectric directly contacts the fins 20 and the second dielectric layer 36.

In the Y-Y view 42, source contact 54, drain contact 56, and gate contact 60 are formed. Additionally, spacers 58 are formed adjacent the gate contact 60, as well as the source and drain contacts 54, 56.

The top-down view 44 illustrates the metal gate 52 extending across the fins 20. In various embodiments, the gate dielectric can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from about 1 nm to about 5 nm, although lesser thicknesses and greater thicknesses are also conceived.

Metal gate can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In summary, the exemplary embodiments of the present invention pertain to a method and structure for fabricating bulk FinFETs with uniform fin channel height and robust STI. Uniform fin channel height is achieved by first forming a fin channel, forming a sacrificial spacer on the fin sidewall, etching the isolation trench, and removing the sacrificial spacer. At this point, the lateral width of the isolation trench is smaller than the spacing between adjacent fins. As a result, the methods conformally deposit a dielectric to completely pinch off the isolation trench while leaving a gap between the fins. Subsequently, etch back is performed to remove the conformal dielectric from the fin sidewalls. A directional deposition is then performed to form a dielectric cap at the fin bottom and on top of the trench isolation. Stated differently, the exemplary embodiments of the present invention pertain to a method and structure for constructing a FinFET with a stair-shaped fin that has a narrow fin top portion and a wide bottom portion. A trench isolation is formed around the wide bottom fin formation. A dielectric cap covers the fin bottom and top of the trench isolation. A gate contact is formed on fin sidewalls and on the top of the dielectric cap. Source and drain contacts are also formed on each side of the gate contact.

Regarding FIGS. 1-10, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for bulk fin field effect transistor (FinFET) with improved fin channel height uniformity and isolation (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a bulk fin field effect transistor (FinFET) with uniform fin channel height, the method comprising:
   recessing a semiconductor substrate to form a plurality of fins;
   forming sacrificial spacers adjacent the plurality of fins;
   recessing the semiconductor substrate to form a stepped configuration shallow trench isolation (STI) defining a plurality of trenches;
   removing the sacrificial spacers; and
   depositing a conformal dielectric to pinch off a bottom portion of plurality of trenches defined by the stepped configuration STI.

2. The method of claim 1, further comprising etching the conformal dielectric to form isolation regions in the bottom portion of the plurality of trenches.

3. The method of claim 2, further comprising forming a second dielectric layer over the isolation regions by directional deposition.

4. The method of claim 3, wherein the second dielectric layer includes silicon oxynitride (SiON).

5. The method of claim 4, wherein the SiON layer has a thickness of about 6 nm.

6. The method of claim 1, wherein the semiconductor substrate is a single crystalline silicon substrate.

7. The method of claim 1, wherein a height of the plurality of fins is about 40 nm, a width of the plurality of fins is about 6 nm, and a gap between the plurality of fins is about 26 nm.

8. The method of claim 1, wherein a thickness of the sacrificial spacers is about 4 nm.

9. The method of claim 1, wherein the conformal dielectric is deposited by atomic layer deposition (ALD) and has a thickness of about 10 nm.

10. A method for forming a bulk fin field effect transistor (FinFET) with uniform fin channel height and uniform shallow trench isolation (STI), the method comprising:

performing a two-step fin etch process to construct a stepped configuration STI defining a plurality of trenches; and depositing a conformal dielectric to pinch off a bottom portion of plurality of trenches defined by the stepped configuration STI.

11. The method of claim 10, wherein the two-step fin etch process involves forming sacrificial spacers adjacent a plurality of fins after the first fin etch.

12. The method of claim 11, wherein the two-step fin etch process involves removing the sacrificial spacers adjacent the plurality of fins after the second fin etch.

13. The method of claim 12, further comprising etching the conformal dielectric to form isolation regions in the bottom portion of the plurality of trenches.

14. The method of claim 13, further comprising forming a second dielectric layer over the isolation regions by directional deposition.

15. The method of claim 14, wherein the second dielectric layer includes silicon oxynitride (SiON).

16. The method of claim 15, wherein a height of the plurality of fins is about 40 nm, a width of the plurality of fins is about 6 nm, and a gap between the plurality of fins is about 26 nm.

17. The method of claim 16, wherein a thickness of the sacrificial spacers is about 4 nm.

18. The method of claim 10, wherein the semiconductor substrate is a single crystalline silicon substrate.

\* \* \* \* \*